United States Patent
Venugopal et al.

(10) Patent No.: US 10,261,563 B1
(45) Date of Patent: Apr. 16, 2019

(54) HYBRID POWER SWITCH

(71) Applicant: Apple Inc., Cupertino, CA (US)

(72) Inventors: Vivekanandan Venugopal, San Jose, CA (US); Ajay Kumar Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/839,317

(22) Filed: Dec. 12, 2017

(51) Int. Cl.
*H03K 17/16* (2006.01)
*G06F 1/3206* (2019.01)
*G06F 17/50* (2006.01)
*H03K 17/62* (2006.01)
*H03K 17/22* (2006.01)

(52) U.S. Cl.
CPC ........ *G06F 1/3206* (2013.01); *G06F 17/5068* (2013.01); *H03K 17/223* (2013.01); *H03K 17/6235* (2013.01)

(58) Field of Classification Search
CPC ............... H03K 3/012; H03K 17/0822; H03K 19/0016; H01L 27/0248; G06F 1/26
USPC ....... 327/108, 112, 143, 175, 186, 333, 434, 327/480, 523, 478, 543; 326/82–86
See application file for complete search history.

(56) References Cited

U.S. PATENT DOCUMENTS

| | | | |
|---|---|---|---|
| 5,274,601 A * | 12/1993 | Kawahara | G11C 5/14 327/427 |
| 7,355,455 B2 * | 4/2008 | Hidaka | G11O 5/147 326/121 |
| 8,542,054 B2 * | 9/2013 | Takayanagi | H03K 19/0016 307/130 |
| 9,240,223 B2 | 1/2016 | Song | |
| 9,515,661 B2 * | 12/2016 | Kato | H03K 3/012 |
| 9,766,827 B1 * | 9/2017 | Meinerzhagen | G06F 3/0619 |
| 2010/0219800 A1 * | 9/2010 | Fukuoka | H01L 27/0203 323/282 |
| 2015/0022218 A1 | 1/2015 | Schreiber et al. | |
| 2015/0280703 A1 * | 10/2015 | Jeon | H03K 17/165 327/382 |
| 2015/0371686 A1 * | 12/2015 | Van Winkelhoff | G11C 11/418 365/189.011 |
| 2016/0035405 A1 | 2/2016 | Kawasumi | |

* cited by examiner

*Primary Examiner* — Rajnikant B Patel
(74) *Attorney, Agent, or Firm* — Meyertons, Hood, Kivlin, Kowert & Goetzel, P.C.

(57) ABSTRACT

A method and apparatus for controlling a power switch are disclosed. A power switch may be coupled between a power supply signal and a virtual power supply signal coupled to a circuit block. The power switch may be configured to couple the power supply signal to the virtual power supply signal based on a first control signal, and reduce a voltage level of the virtual power supply signal to a voltage level less than a voltage level of the power supply signal based on a second control signal. The power switch may be further configured to change a current flowing from the power supply signal to the virtual power supply signal based on a third control signal.

19 Claims, 5 Drawing Sheets

HYBRID POWER SWITCH

BACKGROUND

Technical Field

The embodiments described herein generally relate to power management and control in an integrated circuit, specifically the use of power switches for power gating.

Description of the Relevant Art

Integrated circuits may include multiple circuit blocks designed to perform various functions. For example, an integrated circuit may include a memory circuit block configured to store multiple program instructions, and a processor or processor core configured to retrieve the program instructions from the memory, and execute the retrieved instructions In some integrated circuits, different circuit blocks or different portions of a particular circuit block may operate using different power supply voltage levels. Circuit blocks or portions of circuits blocks operating using a common power supply voltage level may be referred as being included in a common power domain. In some integrated circuits, the different power supply voltage levels used within the such integrated circuits may be generated by a Power Management Unit (commonly referred to as a "PMU") or other suitable circuits. Such PMUs may include voltage regulator circuits and supporting control circuits configured to generate the desired power supply voltage levels.

During operation of an integrated circuit, some circuit blocks or portions of a particular circuit may be unused for periods of time. To reduce power dissipation of the integrated circuit, the unused circuit blocks or portions of the particular circuit block may be decoupled from their respective power supplies. In response to a determination that a currently unused circuit block is to return to an active state, the currently unused circuit block is re-coupled to its respective power supply prior to resuming operation.

SUMMARY OF THE EMBODIMENTS

Various embodiments of a power switch are disclosed. Broadly speaking, an apparatus and a method are contemplated, in which a circuit block is coupled to a virtual power supply signal and a power switch is coupled to a power supply signal and the virtual power supply signal. The power switch may be configured to couple the power supply signal to the virtual power supply signal based on a first control signal and reduce a voltage level of the virtual power supply signal from a first voltage level to a second voltage level based on a second control signal, wherein the second voltage level is less than a voltage level of the power supply signal. The power switch may be further configured to change a current flowing from the power supply signal to the virtual power supply signal based on a third control signal.

In one embodiment, the power switch includes a first device that has a first terminal coupled to the power supply signal and a second terminal coupled to the virtual power supply signal. To reduce the voltage level of the virtual power supply signal, the power switch may be configured to couple a control terminal of the first device to the virtual power supply signal.

In another non-limiting embodiment, to couple the control terminal of the first device to virtual power supply signal, the power switch is may be configured to activate a second device that has a first terminal coupled to the control terminal of the first device, and a second terminal coupled to the virtual power supply signal.

These and other embodiments will become apparent upon reference to the following description and accompanying drawings.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

To manage power dissipation in a computing system, inactive circuit blocks may be de-coupled from their power supply signals to reduce power dissipation associated with leakage current flowing through the inactive circuit blocks. Transistors, or other transconductance devices, may be employed as "power switches" to selectively couple or de-couple a circuit block to or from its associated power supply. Different circuit blocks or portions of a particular circuit block may include one or more power switches to be used for power management.

When a power switch is included in a circuit block, it typically serves a single purpose. The embodiments illustrated in the drawings and described below may provide techniques for allowing a power switch to perform multiple functions, which may reduce active power consumption by reducing the voltage level of the power supply for a circuit block, and may reduce leakage within the power switch itself.

Figure 1:
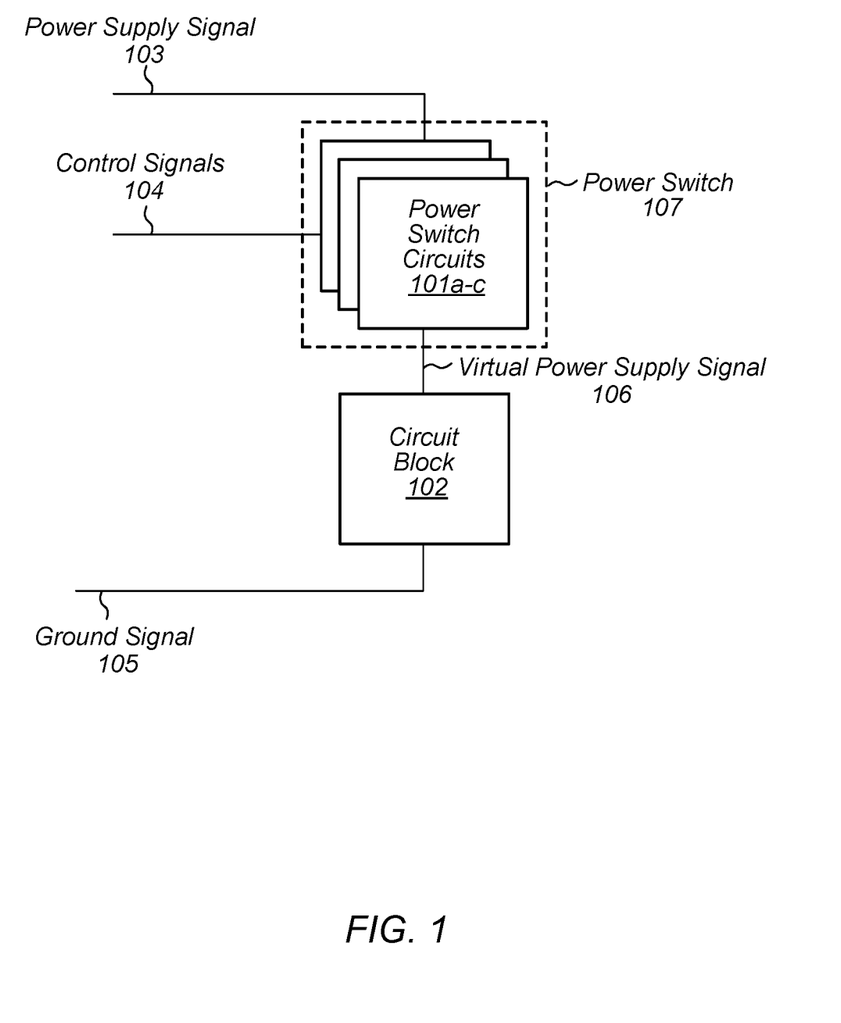
FIG. 1 illustrates a block diagram of a power switch coupled to a circuit block.

An embodiment of a power switch circuit coupled to a circuit block is illustrated in FIG. 1. In the illustrated embodiment, power switch 107 is coupled to circuit block 102 via virtual power supply signal 106. Power switch 107 is also coupled to power supply signal 103 and control signals 104. Circuit block 102 is also coupled to ground signal 105.

Power switch 107 may be configured to couple the power supply signal 103 to the virtual power supply signal 106 based on a first control signal of control signals 104. In response to the assert of the first control signal, power switch 107 may activate a particular one of power switch circuits 101a-c, to provide a conduction path from power supply signal 103 to virtual power supply signal 106, thereby allowing circuit block 102 to draw power from power supply signal 103.

Control signals 104 may, in various embodiments, be generated by a power management circuit, or other suitable circuit included in an integrated circuit. The power management circuit may selectively activate one or more signals included in control signals 104 to couple and de-couple circuit block 102 from power supply signal 103 as part of the power management of the integrated circuit.

In some cases, it may be desirable to reduce a voltage level of a local power supply signal for a particular circuit block. For example, when a memory circuit is not in use, the voltage level of the power supply coupled to the data storage cells may be reduced to a level that maintains data stored in the data storage cells, but is not suitable for read and write operations. Such a reduction may reduce leakage power consumption in the memory circuit, thereby reducing overall power consumption of an integrated circuit or computing system.

To allow for such a reduction in the voltage level of a local power supply signal, power switch 107 may be configured to reduce a voltage level of virtual power supply signal 106 from a first voltage level to a second voltage level based on a second control signal of control signals 104. In various embodiments, the second voltage level is less than a voltage level of the power supply signal 103. As described below in more detail, devices included in power switch circuits 101a-c may be activated, resulting a diode voltage drop across power switch 107, thereby reducing the voltage level of virtual power supply signal 106.

As part of power management of an integrated circuit including circuit block 102, it may be desirable to limit an amount of current flowing into circuit block 102. For example, when circuit block 102 switches operational modes, it may suddenly draw a larger amount of current from power supply signal 103. Such changes in current drawn may result in a droop in a voltage level of power supply signal 103, which may limit performance of other circuit blocks coupled to power supply signal 103.

To remediate such changes in the voltage level of power supply signal 103, power switch 107 may also be configured to change a current flowing from power supply signal 103 to virtual power supply signal 106 based on a third control signal of control signals 104. In various embodiments, the third control signal may selectively activate different numbers of power switch circuits 101a-c. By activating more power switch circuits, the effective impedance between power supply signal 103 and virtual power supply signal 106 may be reduce, increasing an amount of current that may flow between the two signals. Alternatively, when fewer power switch circuits are activated, the effective impedance between power supply signal 103 and virtual power supply signal 106 may increase, thereby reducing an amount of current that may flow between the two signals.

In various embodiments, circuit block 102 may be a processor circuit, memory circuit, input/output circuit, analog/mixed signal circuit, or any other suitable circuit included in an integrated circuit. In other embodiments, circuit block 102 may correspond to a portion of any of the aforementioned circuits.

It is noted that the embodiment depicted in FIG. 1 is merely an example. Although power switch 107 is depicted as including three power switch circuits, in other embodiments, any suitable number of power switch circuits may be employed.

Figure 2:
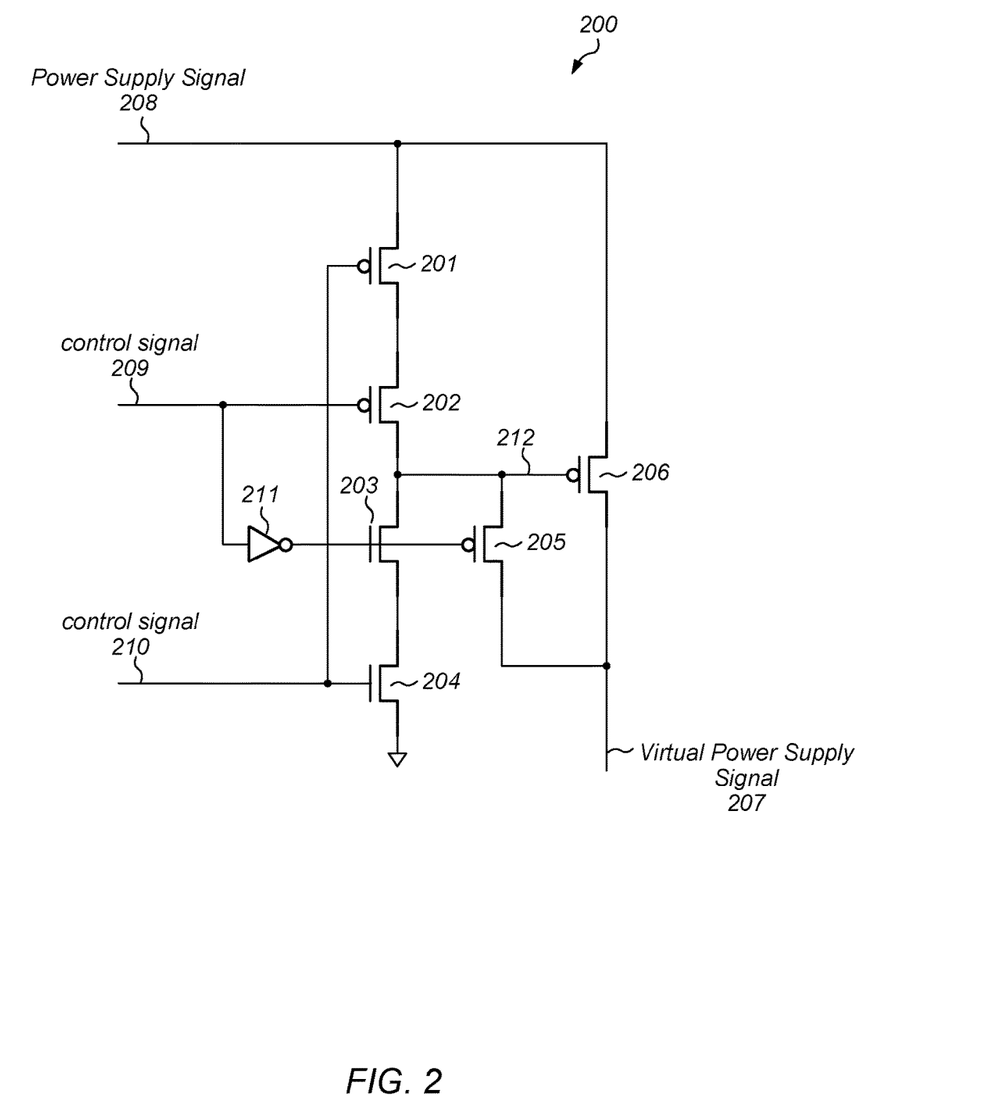
FIG. 2 illustrates a block diagram of power switch circuit.

As described above, power switch circuits 101a-c may be configured to perform various operations. An embodiment of such a power switch circuit is illustrated in FIG. 2. Power switch circuit 200 may, in various embodiments, correspond to any of power switch circuits 101a-c. In the illustrated embodiment, power switch circuit 200 includes devices 201-206, and inverter 211.

Device 201 is coupled to power supply signal 208 and device 202, and is controlled by control signal 210. Device 202 is coupled to device 201 and signal 212, and is controlled by control signal 209. Device 203 is coupled to signal 212 and device 204, and is controlled by the output of inverter 211. Device 204 is coupled to device 203 and a ground supply signal, and is controlled by control signal 210. It is noted that in various embodiments, power supply signal 208 may correspond to power supply signal 103, and control signals 209 and 210 may be included in control signals 104 as depicted in FIG. 1.

Device 206 is coupled between power supply signal 208 and virtual power supply signal 207, and is controlled by signal 212. Device 205 is coupled between signal 212 and virtual power supply signal 207, and is controlled by the output of inverter 211. It is noted that virtual power supply signal 207 may, in various embodiments, correspond to virtual power supply signal 106 as depicted in FIG. 1.

As used and described herein, device refers to a device whose transfer conductance (commonly referred to as "transconductance") is a function of a voltage level across an input of the device. Such devices may include, without limitation, bipolar transistors, field-effect transistors, metal-oxide semiconductor field-effect transistors (MOFETs), and the like. For example, in the embodiment of FIG. 2, device 201, 202, 205 and 206 may be particular embodiments of p-channel MOSFETs, and device 203 and 204 may be particular embodiments of n-channel MOSFETs.

It is noted that an inverter, such as those shown and described herein, may be a particular embodiment of an CMOS inverting amplifier. In other embodiments, however, any suitable configuration of inverting amplifier that is capable of inverting the logical sense of a signal may be used, including inverting amplifiers built using technology other than CMOS.

During operation, when control signal 210 is at a high logic level and control signal 209 is a at a low logic level, devices 203 and 204 are active, allowing signal 212 to discharge to ground, thereby activating device 206. With device 206 active, power supply signal 208 is coupled to virtual power supply signal 207, allowing a load circuit, such as, e.g., circuit block 102, coupled to virtual power supply signal to draw power from power supply signal 208.

As used and described herein, a logical-0, logic 0 value or low logic level, describes a voltage sufficient to activate a p-channel metal-oxide semiconductor field effect transistor (MOSFET), and that a logical-1, logic 1 value, or high logic level describes a voltage level sufficient to activate an n-channel MOSFET. It is noted that, in various other embodiments, any suitable voltage levels for logical-0 and logical-1 may be employed.

When control signal 210 is transitioned to a low logic level, device 204 is deactivated, breaking the circuit path that is discharging signal 212 to ground. Instead, device 201 is activated, and since control signal 209 is also at a low logic level, device 202 is also active, thereby coupling signal 212 to power supply signal 208, in order to charge signal 212 to a high logic level. When signal 212 is at a high logic level, device 206 is deactivated, de-coupling power supply signal 208 from virtual power supply signal 207 and isolating any load circuit from power supply signal 208.

As described above, a power switch circuit may be used to reduce a voltage level of a virtual power supply. In the present embodiment, this may be accomplished by setting control signal 209 to a high logic level. The high logic level on control signal 209 de-activates devices 202 and 203, and activates device 205. By activating device 205, signal 212 is coupled to virtual power supply signal 207, coupling the gate terminal of device 206 to the drain terminal of device 206.

When a MOSFET has its gate terminal and drain terminal coupled together, the transistor is referred to as being "diode connected." In such a mode, a voltage drop from the source terminal to the gate terminal of the MOSFET is substantially the same the threshold voltage for the device. In the case of power switch circuit 200, when control signal 209 is at a high logic level, the voltage level of virtual power supply signal 207 is less than the voltage level of power supply signal 208 by at least a voltage drop substantially the same as the threshold voltage of device 206.

As described above in regard to FIG. 1, multiple power switch circuits, such as power switch circuit 200, may be included in a single power switch. In such cases, the power switch circuits may be coupled in parallel, and each power switch circuit may have its own version of control signals 209 and 210. In other embodiments, each power circuit may share control signal 209, and have respective versions of control signals 210 to allow for different numbers of power switch circuits to be activated, to provide different impedance values between power supply signal 208 and virtual power supply signal 207.

It is noted that the embodiment depicted in FIG. 2 is merely an example. In other embodiments, different devices and different number of devices are possible and contemplated.

It is noted that an inverter, such as those shown and described herein, may be a particular embodiment of an CMOS inverting amplifier. In other embodiments, however, any suitable configuration of inverting amplifier that is capable of inverting the logical sense of a signal may be used, including inverting amplifiers built using technology other than CMOS.

Figure 3:
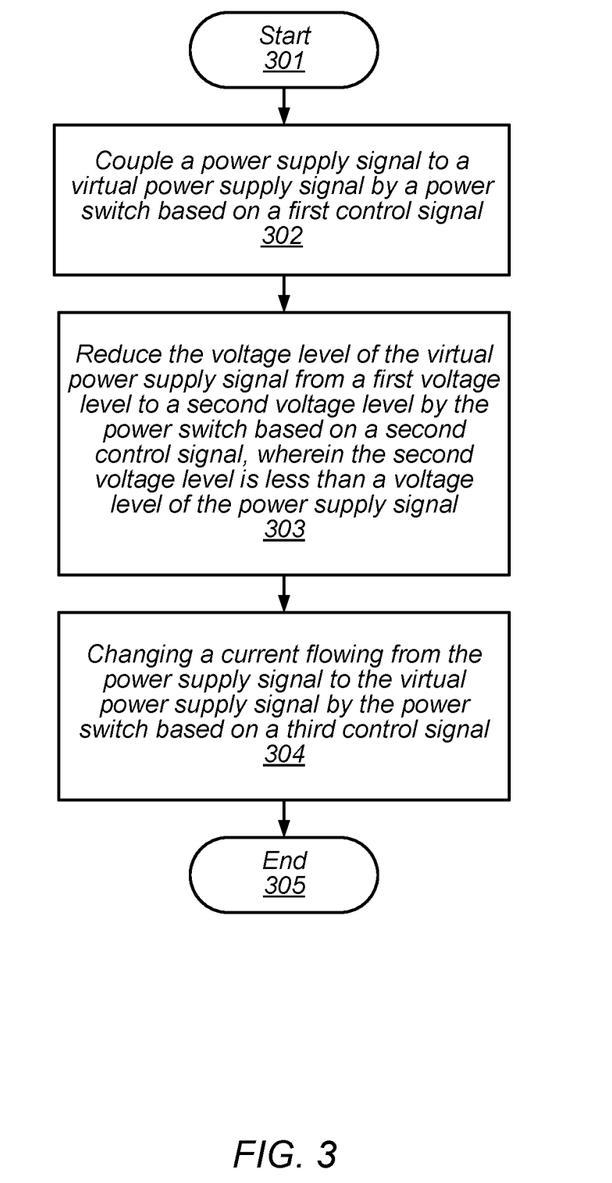
FIG. 3 illustrates flow diagram depicting an embodiment of a method for operating a power switch.

Turning to FIG. 3 a flow diagram depicting a method for operating a power switch is illustrated. The method begins in block 301. A power switch may then couple a power supply signal to a virtual power supply signal based on a first control signal (block 302). In various embodiments, the power switch may include multiple power switch circuits, each controlled by a separate first control signal.

A voltage level of the virtual power supply signal may then be reduced by the power switch from a first voltage level to a second voltage level based on a second control signal (block 303). In various embodiments, the second voltage level is less than a voltage level of the power supply signal. In some embodiments, the power switch includes a first device coupled between the power supply signal and the virtual power supply signal. Based on a voltage level of the second control signal, a second device may couple a control terminal of the first device to another terminal of the first device, thereby placing the first device in a diode connected configuration. In such cases, the voltage difference between the voltage level of the power supply signal and the virtual power supply signal may be substantially the same as the threshold voltage of the first device.

The power switch may then change a current flowing from the power supply signal to the virtual power supply signal based on a third control signal (block 304). To change the changing the current flowing from the power supply signal to the virtual power supply signal, the power switch may change an impedance between the power supply signal and the virtual power supply signal by the power switch based on the third control signal.

In some embodiments, the power switch may include multiple power switch circuit coupled in parallel between the power supply signal and the virtual power supply signal. To adjust the impedance between the power supply signal and the virtual power supply signal, different numbers of power switch circuits may be activated. By reducing the number of active power switch circuits, the impedance between the power supply signal and the virtual power supply signal may increase, while increasing the number of active power switch circuits, the impedance between the power supply signal and the virtual power supply signal may decrease. The method may then conclude in block 305.

It is noted that the method depicted in FIG. 3 is merely an example. In other embodiments, different operations and different orders of operation are possible and contemplated.

Figure 4:
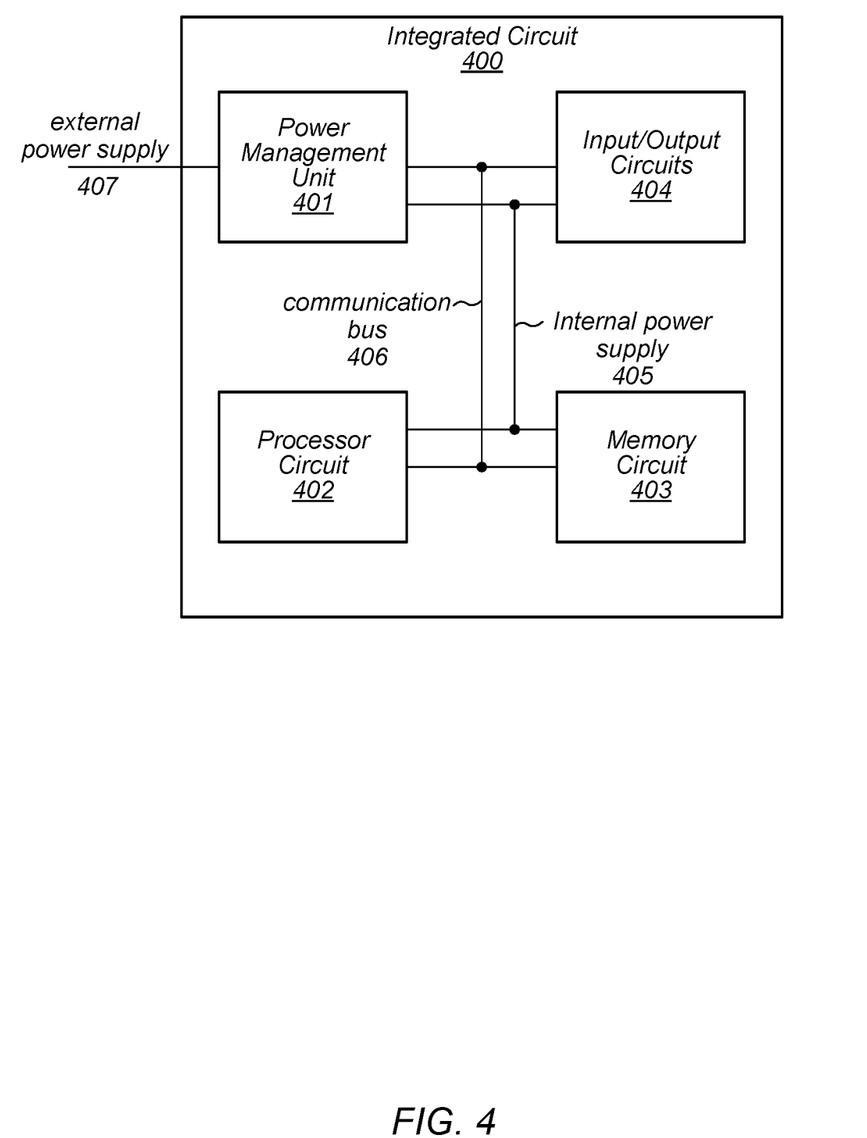
FIG. 4 illustrates a block diagram of an integrated circuit.

A block diagram of an integrated circuit is illustrated in FIG. 4. In the illustrated embodiment, the integrated circuit 400 includes power management unit 401, processor circuit 402, Input/Output circuits 404, and memory circuit 403, each of which may be configured to send requests and data (collectively transactions) to the other circuit blocks using communication bus 406. In various embodiments, integrated circuit 400 may be configured for use in a desktop computer, server, or in a mobile computing application such as, e.g., a tablet, laptop computer, or wearable computing device.

Power management unit 401 may be configured to generate a regulated voltage level on internal power supply 405 in order to provide power to processor circuit 402, input/output circuits 404, and memory circuit 403. In various embodiments, power management unit 401 may include one or more voltage regulator circuits configured to generate the regulated voltage level based on external power supply 407. It is noted that although a single internal power supply is depicted in the embodiment of FIG. 4, in other embodiments any suitable number of internal power supplies may be employed.

Processor circuit 402 may, in various embodiments, be representative of a general-purpose processor that performs computational operations. For example, processor circuit

402 may be a central processing unit (CPU) such as a microprocessor, a microcontroller, an application-specific integrated circuit (ASIC), or a field-programmable gate array (FPGA). In some embodiments, processor circuit 402 may include one or more power switches, such as, e.g., power switch 101 as illustrated in FIG. 1.

Memory circuit 403 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 4, a single memory circuit is depicted. In other embodiments, any suitable number of memory circuits may be employed. In various embodiments, memory circuit 403 may include any suitable number of power switches, such as, e.g., power switch 101 as depicted in FIG. 1.

Input/output circuits 404 may be configured to coordinate data transfer between integrated circuit 400 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 404 may be configured to implement a version of Universal Serial Bus (USB) protocol or IEEE 1394 (Firewire™) protocol.

Input/output circuits 404 may also be configured to coordinate data transfer between integrated circuit 400 and one or more computing devices (e.g., other computing systems or integrated circuits) coupled to integrated circuit 400 via a network. In one embodiment, input/output circuits 404 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 404 may be configured to implement multiple discrete network interface ports.

In various embodiments, input/output circuits 404 may include any suitable combination of logic, mixed-signal, and/or analog circuits configured to performed the aforementioned functions. For example, input/output circuits 404 may include RF circuits configured to send and receive data via a wireless or cellular network. Input/output circuits 404 may, in some embodiments, include one or more power switches, such as, e.g., power switch 101, to allow portions of the circuitry included in input/output circuits 404 to be decoupled from a power supply when not in use.

It is noted that the integrated circuit depicted in FIG. 4 is merely an example. In other embodiments, integrated circuit 400 may include different circuit blocks configured to perform different tasks or operations.

Figure 5:
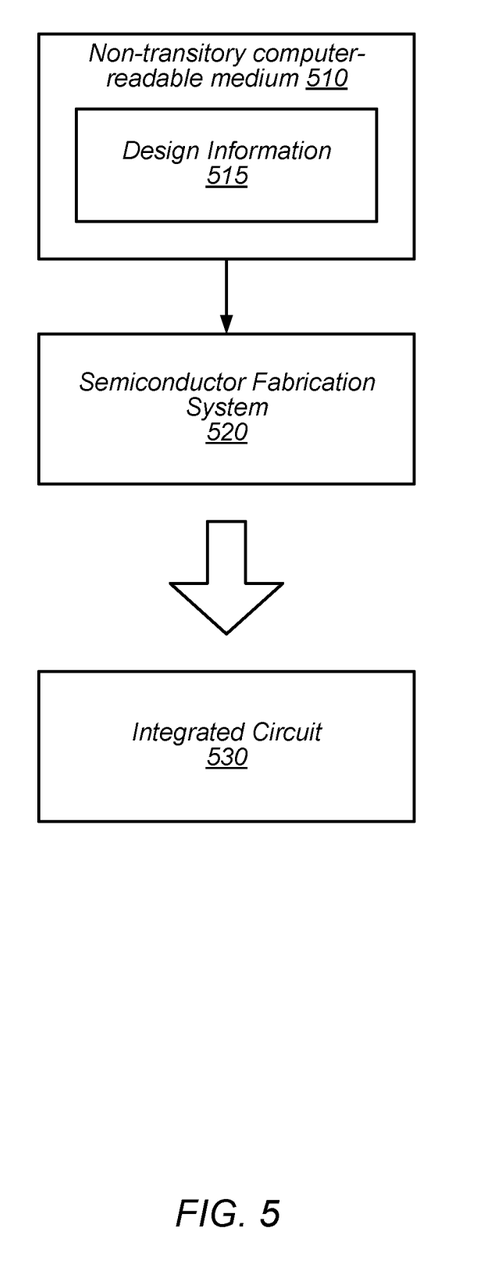
FIG. 5 illustrates a block diagram illustrating an embodiment of a computer-readable storage medium.

FIG. 5 is a block diagram illustrating an example non-transitory computer-readable storage medium that stores circuit design information, according to some embodiments. In the illustrated embodiment, semiconductor fabrication system 520 is configured to process the design information 515 stored on non-transitory computer-readable storage medium 510 and fabricate integrated circuit 530 based on the design information 515.

Non-transitory computer-readable storage medium 510, may comprise any of various appropriate types of memory devices or storage devices. Non-transitory computer-readable storage medium 510 may be an installation medium, e.g., a CD-ROM, floppy disks, or tape device; a computer system memory or random access memory such as DRAM, DDR RAM, SRAM, EDO RAM, LPDDRxx, HBMxx, wideIOxx, Rambus RAM, etc.; a non-volatile memory such as a Flash, magnetic media, e.g., a hard drive, or optical storage; registers, or other similar types of memory elements, etc. Non-transitory computer-readable storage medium 510 may include other types of non-transitory memory as well or combinations thereof. Non-transitory computer-readable storage medium 510 may include two or more memory mediums which may reside in different locations, e.g., in different computer systems that are connected over a network.

Design information 515 may be specified using any of various appropriate computer languages, including hardware description languages such as, without limitation: VHDL, Verilog, SystemC, SystemVerilog, RHDL, M, MyHDL, etc. Design information 515 may be usable by semiconductor fabrication system 520 to fabricate at least a portion of integrated circuit 530. The format of design information 515 may be recognized by at least one semiconductor fabrication system, such as semiconductor fabrication system 520, for example. In some embodiments, design information 515 may include a netlist that specifies elements of a cell library, as well as their connectivity. One or more cell libraries used during logic synthesis of circuits included in integrated circuit 530 may also be included in design information 515. Such cell libraries may include information indicative of device or transistor level netlists, mask design data, characterization data, and the like, of cells included in the cell library.

Integrated circuit 530 may, in various embodiments, include one or more custom macrocells, such as memories, analog or mixed-signal circuits, and the like. In such cases, design information 515 may include information related to included to macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 520 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 520 may also be configured to perform various testing of fabricated circuits for correct operation.

In various embodiments, integrated circuit 530 is configured to operate according to a circuit design specified by design information 515, which may include performing any of the functionality described herein. For example, integrated circuit 530 may include any of various elements shown or described herein. Further, integrated circuit 530 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a circuit block coupled to a virtual power supply signal; and
   a power switch including a first device with a first terminal coupled to a power supply signal and a second terminal coupled to the virtual power supply signal, wherein the power switch is configured to:
      couple the power supply signal to the virtual power supply signal based on a first control signal;
      reduce a voltage level of the virtual power supply signal from a first voltage level to a second voltage level based on a second control signal by coupling a control terminal of the first device to the virtual power supply signal, wherein the second voltage level is less than a voltage level of the power supply signal; and
      change a current flowing from the power supply signal to the virtual power supply signal based on a third control signal.

2. The apparatus of claim 1, wherein to couple the control terminal of the first device to virtual power supply signal, the power switch is further configured to activate a second device, wherein a first terminal of the second device is coupled to the control terminal of the first device, and a second terminal of the second device is coupled to the virtual power supply signal.

3. The apparatus of claim 1, wherein the power switch is further configured to reduce the voltage level of the virtual power supply signal based on at least one operational parameter of the circuit block.

4. The apparatus of claim 1, wherein to change the current flowing from the power supply signal to the virtual power supply signal, the power switch is further configured to change an impedance between the power supply signal and the virtual power supply signal based on the third control signal.

5. The apparatus of claim 4, wherein to change the impedance between the power supply signal and virtual power supply signal, the power switch is further configured to selectively activate one or more of a plurality of devices using the third control signal, wherein a first terminal of a particular device of the plurality of devices is coupled to the power supply signal and a second terminal of the particular device is coupled to the virtual power supply signal.

6. A method, comprising:
   coupling a power supply signal to a virtual power supply signal based by a power switch based on a first control signal, wherein the virtual power supply signal is coupled to a circuit block;
   reducing, by the power switch, a voltage level of the virtual power supply signal from a first voltage level to a second voltage level based on a second control signal, wherein the second voltage level is less than a voltage level of the power supply signal; and
   changing a current flowing from the power supply signal to the virtual power supply signal by the power switch based on a third control signal.

7. The method of claim 6, wherein reducing the voltage level of the virtual power supply signal includes coupling a control terminal of a first device to the virtual power supply signal, wherein a first terminal of the first device is coupled to the power supply signal and a second terminal of the first device is coupled to the virtual power supply signal.

8. The method of claim 7, wherein coupling the control terminal of the first device to virtual power supply signal includes activating a second device, wherein a first terminal of the second device is coupled to the control terminal of the first device, and a second terminal of the second device is coupled to the virtual power supply signal.

9. The method of claim 6, further comprising reducing the voltage level of the virtual power supply signal based on at least one operational parameter of the circuit block.

10. The method of claim 6, wherein changing the current flowing from the power supply signal to the virtual power supply signal includes changing an impedance between the power supply signal and the virtual power supply signal by the power switch based on a third control signal.

11. The method of claim 10, wherein changing the impedance between the power supply signal and virtual power supply signal includes, selectively activating one or more of a plurality of devices using the third control signal, wherein a first terminal of a particular device of the plurality of devices is coupled to the power supply signal and a second terminal of the particular device is coupled to the virtual power supply signal.

12. The method of claim 6, further comprising decoupling the power supply signal from the virtual power supply signal by the power switch based on a particular value of the first control signal, and coupling the power supply signal to the virtual power supply signal by the power switch based on another value of the first control signal.

13. A non-transitory computer-readable storage medium having design information stored thereon, wherein the design information specifies a design of at least a portion of a hardware integrated circuit in a format recognized by a semiconductor fabrication system that is configured to use the design information to produce the hardware integrated circuit according to the design information, wherein the design information specifies that the hardware integrated circuit comprises:
   a circuit block coupled to a virtual power supply signal; and
   a power switch coupled to a power supply signal and the virtual power supply signal, wherein the power switch is configured to:
      couple the power supply signal to the virtual power supply signal based on a first control signal;
      reduce a voltage level of the virtual power supply signal from a first voltage level to a second voltage level based on a second control signal, wherein the second voltage level is less than a voltage level of the power supply signal; and change a current flowing from the power supply signal to the virtual power supply signal based on a third control signal.

14. The non-transitory computer-readable storage medium of claim 13, wherein the power switch includes a first device, wherein a first terminal of the first device is coupled to the power supply signal and a second terminal of the first device is coupled to the virtual power supply signal, and wherein to reduce the voltage level of the virtual power supply signal, the power switch is configured to couple a control terminal of a first device to the virtual power supply signal.

15. The non-transitory computer-readable storage medium of claim 14, wherein to couple the control terminal of the first device to virtual power supply signal, the power switch is further configured to activate a second device, wherein a first terminal of the second device is coupled to the control terminal of the first device, and a second terminal of the second device is coupled to the virtual power supply signal.

16. The non-transitory computer-readable storage medium of claim 13, wherein the power switch is further configured to reduce the voltage level of the virtual power supply signal based on at least one operational parameter of the circuit block.

17. The non-transitory computer-readable storage medium of claim 13, wherein to change the current flowing from the power supply signal to the virtual power supply signal, the power switch is further configured to change an impedance between the power supply signal and the virtual power supply signal based on the third control signal.

18. The non-transitory computer-readable storage medium of claim 17, wherein to change the impedance between the power supply signal and virtual power supply signal, the power switch is further configured to selectively activate one or more of a plurality of devices using the third control signal, wherein a first terminal of a particular device of the plurality of devices is coupled to the power supply signal and a second terminal of the particular device is coupled to the virtual power supply signal.

19. The non-transitory computer-readable storage medium of claim 13, wherein the power switch is further configured to decouple the power supply signal from the virtual power supply signal based on a particular value of the first control signal, and couple the power supply signal to the virtual power supply signal based on another value of the first control signal.

* * * * *